United States Patent
Lei et al.

(10) Patent No.: US 11,705,923 B2
(45) Date of Patent: Jul. 18, 2023

(54) METHOD AND APPARATUS FOR STORING DATA, AND COMPUTER DEVICE AND STORAGE MEDIUM THEREOF

(71) Applicants: ENVISION DIGITAL INTERNATIONAL PTE. LTD., Singapore (SG); SHANGHAI ENVISION DIGITAL CO., LTD., Shanghai (CN)

(72) Inventors: Li Lei, Shanghai (CN); Hong Zhao, Shanghai (CN); Xiaomeng Chen, Shanghai (CN); Degang Ning, Shanghai (CN)

(73) Assignees: ENVISION DIGITAL INTERNATIONAL PTE. LTD., Singapore (SG); SHANGHAI ENVISION DIGITAL CO., LTD., Shanghai (CN)

( * ) Notice: Subject to any disclaimer, the term of this patent is extended or adjusted under 35 U.S.C. 154(b) by 0 days.

(21) Appl. No.: 17/779,038

(22) PCT Filed: Nov. 20, 2020

(86) PCT No.: PCT/SG2020/050680
§ 371 (c)(1),
(2) Date: May 23, 2022

(87) PCT Pub. No.: WO2021/101451
PCT Pub. Date: May 27, 2021

(65) Prior Publication Data
US 2023/0006688 A1    Jan. 5, 2023

(30) Foreign Application Priority Data

Nov. 22, 2019 (CN) .......................... 201911154471.7

(51) Int. Cl.
  H03M 7/24 (2006.01)
  H03M 7/30 (2006.01)

(52) U.S. Cl.
  CPC ........... *H03M 7/24* (2013.01); *H03M 7/3059* (2013.01)

(58) Field of Classification Search
  CPC .............................. H03M 7/24; H03M 7/3059
  (Continued)

(56) References Cited

U.S. PATENT DOCUMENTS 5,317,526 A     5/1994 Urano et al.
2003/0078921 A1  4/2003 Michael Hsing et al.
(Continued)

FOREIGN PATENT DOCUMENTS

WO    WO-2014116712 A1 *  7/2014  .............. G06F 7/38

OTHER PUBLICATIONS

Mathis et al., "A Novel Single/Double Precision Normalized IEEE 754 Floating-Point Adder/Subtracter". 2019 IEEE Computer Society Annual Symposium on VLSI (ISVLSI), Jul. 17, 2019 [Retrieved on Mar. 10, 2021] <DOI: 10.1109/ISVLSI.2019.00058> Table 1, figure 2, equation 9, p. 281, section 3.
(Continued)

*Primary Examiner* — Tan V Mai
(74) *Attorney, Agent, or Firm* — JCIP; Joseph G. Chu; Jeremy I. Maynard

(57) ABSTRACT

Disclosed are a method and apparatus for storing data. The method includes: acquiring data to be stored; converting the data to be stored from an initial data type to a target data type, a data length corresponding to the target data type being less than that corresponding to the initial data type; and storing the data to be stored of the target data type to a database. In the method according to the present disclosure, a storage space occupied by the data to be stored in the
(Continued)

database is greatly reduced. In addition, the method according to the present disclosure is performed prior to lossy or lossless data compression storage of the data to be stored in the related art. That is, on the basis of a compression ratio when the data to be stored is stored in the related art, the present disclosure further improves a compression effect of the data to be stored by reducing the data length when the data to be stored is stored, and further saves storage resources of the database.

12 Claims, 4 Drawing Sheets

(58) Field of Classification Search
USPC ........................................................ 708/204
See application file for complete search history.

(56) References Cited

U.S. PATENT DOCUMENTS

| | | | | |
|---|---|---|---|---|
| 2004/0268094 | A1* | 12/2004 | Abdallah | H03M 7/24 712/221 |
| 2008/0140604 | A1 | 6/2008 | Collier et al. | |
| 2012/0109910 | A1 | 5/2012 | Netz et al. | |
| 2015/0288381 | A1 | 10/2015 | Dickie | |
| 2019/0042244 | A1 | 2/2019 | Henry et al. | |
| 2019/0122094 | A1 | 4/2019 | Chen et al. | |
| 2019/0332732 | A1* | 10/2019 | Kintali | G06F 30/20 |
| 2020/0285468 | A1 | 9/2020 | Bocco et al. | |

OTHER PUBLICATIONS

International Search Report and Written Opinion of International Searching Authority dated Mar. 12, 2021 for International Application No. PCT/SG2020/050680.
International Preliminary Report on Patentability dated Mar. 2, 2022 for International Application No. PCT/SG2020/050680.
Notice of Preliminary Rejection dated Jul. 20, 2022 from the Korean Intellectual Property Office for Korean Application No. 10-2022-7021080.
Substantive Examination Adverse Report by Intellectual Property Corporation of Malaysia dated Dec. 13, 2022 for Malaysian Application No. PI2022002630.
Extended European Search Report dated Nov. 22, 2022 for European Application No. 20890086.0.
Notice of Preliminary Rejection dated Nov. 29, 2022 for Korean Application No. 10-2022-7021080.
Mathis et al., "A Novel Single/Double Precision Normalized IEEE 754 Floating-Point Adder/Subtracter". 2019 IEEE Computer Society Annual Symposium on VLSI (ISVLSI), Sep. 19, 2019, pp. 278-283.
Notification of Reasons for Refusal dated Dec. 27, 2022 for Japanese Patent Application No. 2022-529722.
Examination Report No. 1 dated Mar. 2, 2023 for Australian Application No. 2020385942.

* cited by examiner

METHOD AND APPARATUS FOR STORING DATA, AND COMPUTER DEVICE AND STORAGE MEDIUM THEREOF

TECHNICAL FIELD

Embodiments of the present disclosure relate to the field of data storage, and in particular relate to a method and apparatus for storing data, and a computer device and a storage medium thereof.

BACKGROUND

With the rapid development of Internet of things, data monitoring systems based on the Internet of things have begun to be applied on a large scale.

The basic function of the data monitoring system is to acquire data and to store the data to a database. Most data storage solutions are to store the acquired data and to perform lossy or lossless compression on the stored data.

The validity and a storage space of the data are associated with the lossy or lossless compression mode. For example, lossy compression realizes data compression by reducing original data, such that the validity of the data cannot be guaranteed; and lossless compression is to express repeating portions in the data by means of encoding to realize data compression, which reduces the storage space of the data to a certain extent but still obtains a smaller compression ratio than a compression ratio under lossy compression. That is, the data storage solutions in the related art fail to solve the problem of how to increase the data compression ratio on the premise of not damaging the validity of the data.

SUMMARY

Embodiments of the present disclosure provide a method and apparatus for storing data, and a computer device and a storage medium thereof, which may increase a data compression ratio on the premise of not impairing the validity of data. The technical solutions are described as below.

In one aspect, a method for storing data is provided. The method includes: acquiring data to be stored; converting the data to be stored from an initial data type to a target data type, a data length corresponding to the target data type being less than that corresponding to the initial data type; and storing the data to be stored of the target data type to a database.

In another aspect, an apparatus for storing data is provided. The apparatus includes: a data acquiring module, configured to acquire data to be stored; a data converting module, configured to convert the data to be stored from an initial data type to a target data type, a data length corresponding to the target data type being less than that corresponding to the initial data type; and a data storing module, configured to store the data to be stored of the target data type to a database.

In yet another aspect, a computer device is provided. The computer device includes a processor and a memory storing at least one instruction. The at least one instruction, when executed by the processor, causes the processor to perform the method for storing data in the above aspect.

In still another aspect, a computer-readable storage medium storing at least one instruction is provided. The at least one instruction, when executed by a processor, causes the processor to perform the method for storing data in the above aspect.

In the embodiments of the present disclosure, the data to be stored is converted from the initial data type to the target data type after being acquired. Since the data length of the data to be stored that is converted to the target data type is less than that corresponding to the initial data type, a storage space occupied by the data to be stored in the database is greatly reduced before the data to be stored is stored in the database. In addition, the method according to the present disclosure is performed prior to lossy or lossless data compression storage of the data to be stored in the related art. That is, on the basis of a compression ratio when the data to be stored is stored in the related art, the present disclosure further improves a compression effect of the data to be stored by reducing the data length when the data to be stored is stored, and further saves storage resources of the database.

DETAILED DESCRIPTION

Figure 1:
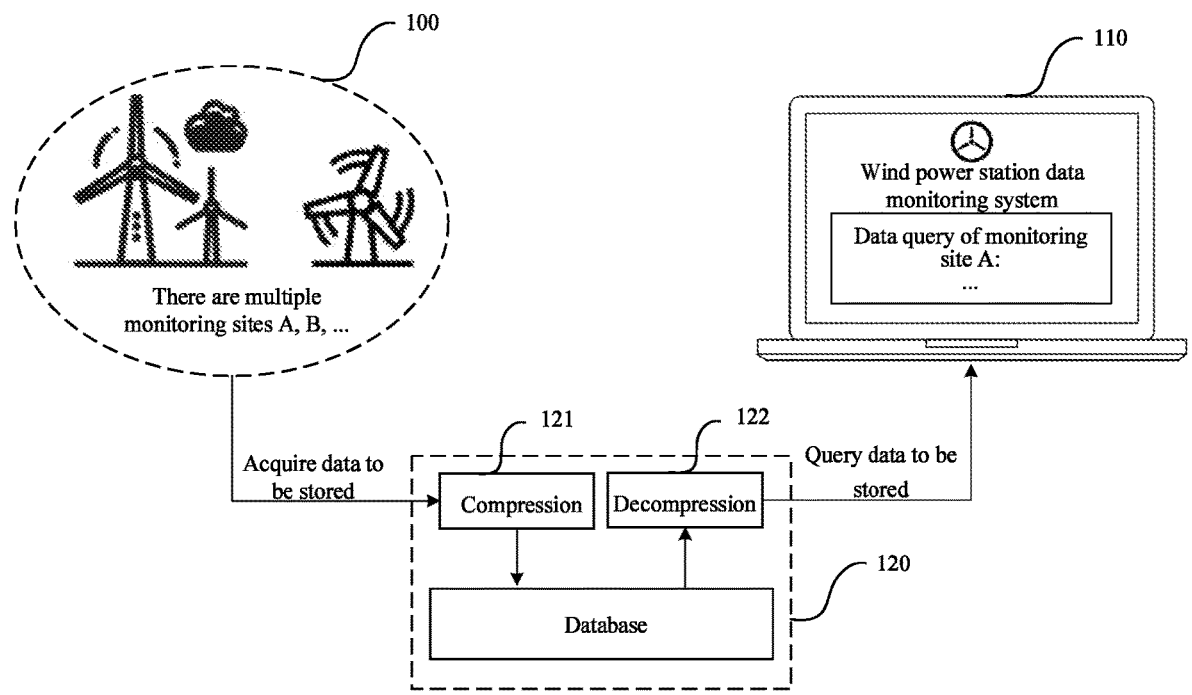
FIG. 1 is a schematic diagram of a method for storing data in accordance with one exemplary embodiment of the present disclosure.

The present disclosure will be described in further detail with reference to the accompanying drawings, to present the objectives, technical solutions, and advantages of the present disclosure more clearly.

The term "plurality" herein refers to two or more. The term "and/or" herein describes the correspondence of the corresponding objects, indicating three kinds of relationship. For example, A and/or B, can be expressed as: A exists alone, A and B exist concurrently, B exists alone. The character "/" generally indicates that the context object is an "OR" relationship.

For ease of understanding, the terms involved in the embodiments of the present disclosure will be explained as below.

Data type: the data types in the present disclosure are data types extensively involved in most databases, including an integer type, a floating-point type and an enumerated type; the integer types include a byte integer type (1 Byte), a short integer type (2 Byte), an ordinary integer type (4 Byte) and a long integer type (>4 Byte); and the floating-point type includes a single-precision floating-point type (4 Byte) and a double-precision floating-point type (8 Byte).

Enumerated value: enumerated values of all data are listed by predefining to define an ordered set; the order of these data is consistent with that of the enumerated values; and in one schematic example, morning=1, afternoon=2 and evening=3, where 1, 2 and 3 are the enumerated values corresponding to the above data.

Lossless data compression: it refers to reconstruction (or called restoration and decompression) of compressed data, and the reconstructed data is exactly the same as the original data.

A database refers to data sets that are stored together in a certain way, can be shared with multiple users, have the least possible redundancy, and are independent of an application. The database can be regarded as an electronic file cabinet (a place for storing electronic files). Users can perform operations such as adding, querying, updating, and deleting data in the files.

Especially with the development of Internet of Things, large-scale databases based on the Internet of Things have emerged, such as time series data collected and generated based on various real-time monitoring, inspection and analysis equipment in the power industry, the chemical industry, and the like. These industrial data have the following typical characteristics: high generation frequency (each monitoring site can generate multiple data in one second), and multiple monitoring sites and large amount of information (the monitoring sites generate data every second, occupying a lot of storage space).

Regarding the data monitoring systems involved in various industries based on the Internet of things, the method for storing data according to the present disclosure can perform data type conversion on data to the stored to reduce the space occupied by data storage. The following embodiments take a time series database based on a wind power station data monitoring system as an example for explanation.

Schematically, FIG. 1 is a schematic diagram of a method for storing data in accordance with one exemplary embodiment of the present disclosure. A wind power station means a place where wind energy is captured, converted to electric energy, and fed into a power grid by a transmission line. In the wind power station 100 shown in FIG. 1, there are multiple monitoring sites (e.g., a monitoring site A and a monitoring point B), and each monitoring point collects data at their own respective monitoring time intervals, and stores the collected data to a database by a computer device 120. After acquiring data to be stored (the data collected by each measuring site), the computer device 120 first inputs the data to be stored into a compression module 121. The compression module 121 can perform the method for storing data according to the present disclosure, i.e., the compression module 121 converts the data to be stored to data to be stored of a target data type. Then, the computer device 120 performs lossless compression on the data to be stored of the target data type, and stores the data to be stored of the target data type that is subjected to the lossless data compression algorithm in the database. When the user queries the data collected by the monitoring site A by a terminal 110, the computer device 120 decompresses and extracts the stored data by a decompression algorithm corresponding to the lossless data compression algorithm.

Figure 2:
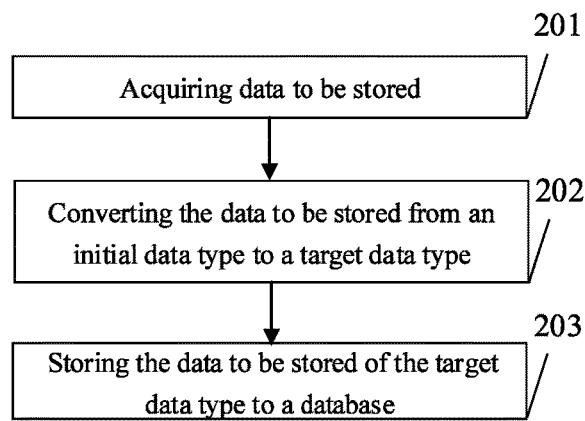
FIG. 2 is a flowchart of a method for storing data in accordance with one exemplary embodiment of the present disclosure.

FIG. 2 is a flowchart of a method for storing data in accordance with one exemplary embodiment of the present disclosure, and this exemplary embodiment is executed by a computer device equipped with a database. The method includes the following steps.

In step 201, data to be stored is acquired.

In some embodiments, the data to be stored is acquired by a data monitoring system via a monitoring sensor, and/or, the data to be stored is data actively input by a user.

In some embodiments, the data to be stored is pre-provided with a data identifier. The user who needs to acquire the data from a database may enter the specific data identifier to acquire the data stored by taking the data identifier as an identifier.

In some embodiments, in order to facilitate data search, the data identifier is relevant to an actual meaning of the data to be stored. Setting rules of the data identifier are not limited in the embodiments of the present disclosure.

In one schematic example, a wind power station data monitoring system includes multiple scenario-relevant monitoring siting, e.g., a temperature monitoring site, a humidity monitoring site and a wind direction monitoring site. The data monitoring system records English identifiers of the monitoring sites as the data identifiers of the monitoring sites. For example, the data identifier corresponding to data of the temperature monitoring site is temperature, and the user may enter the data identifier (temperature) to acquire the data of the temperature monitoring site.

In step 202, the data to be stored is converted from an initial data type to a target data type.

In some embodiments, since the monitoring sites have different actual monitoring objects, the corresponding monitored data is of different initial data types. That is, the data to be stored of the monitoring sites is of different initial data types.

In one schematic example, the wind power station data monitoring system includes a monitoring site for monitoring the number of electric generators currently operating normally, and the initial data type of the data to be stored of the monitoring site is integer data. The wind power station data monitoring system includes a humidity monitoring site, and owing to demands on the precision of the monitoring sensor, data of the humidity monitoring site is accurate to two digits, and the initial data type of the data to be stored of this monitoring site is floating-point data.

In some embodiments, the data to be stored of each monitoring site is preset. When the user has custom requirements on the data type of the monitoring site, the data type of each monitoring site may be preset.

In one schematic example, the data precision of the humidity monitoring site is limited to the precision of one digit, and the initial data type of the data to be stored of this monitoring site is preset as integer data from the floating-point data in the above example.

However, owing the diversity of the data of the monitoring sites, in the process of acquiring the data to be stored for storage, there is a problem that some data to be stored wastes a storage space. For example, the humidity monitoring site requires the precision of three decimal places, the initial data type corresponding to this monitoring site is the floating-point data. When the humidity monitoring site has data to be stored with all three decimal places being zero, it is obvious that the data to be stored may be stored in a shorter byte data type, for example, the data to be stored may be converted from floating-point data to integer data for storage, and the data to be stored has lossless data validity after being converted from the initial data type to the integer data.

In this embodiment, the converted data type is defined as the target data type, and a data length corresponding to the target data type is less than that corresponding to the initial data type.

In some embodiments, based on the specific value of the data to be stored, the data to be stored is converted from the initial data type to the target data type on the premise of not wasting the storage space and guaranteeing the validity of the original data. It is obvious that the corresponding data length of the data to be stored that is converted to the target data type is less than that corresponding to the initial data type.

In step 203, the data to be stored of the target data type is stored to the database.

In some embodiments, after converting the data type of the data to be stored to the target data type, the computer device stores the data to be stored of the target data type in the database, and the data to be stored that is stored in the database may realize data management and sharing, such that the data of each monitoring site may be queried and managed under management requirements of each monitoring system.

In summary, in this embodiment, after acquiring the data to be stored, the computer device converts the data to be stored from the initial data type to the target data type. Since the data length of the data to be stored that is converted to the target data type is less than that corresponding to the initial data type, the storage space occupied by the data to be stored in the database is greatly reduced before the data to be stored is stored in the database. In addition, the method according to this embodiment is performed prior to lossy or lossless data compression storage of the data to be stored in related art. That is, on the basis of a compression ratio when the data to be stored is stored in the related art, the present disclosure further improves a compression effect of the data to be stored by reducing the data length when the data to be stored is stored, and further saves storage resources of the database.

The above schematic example only lists a simple data conversion example (with reference to the specific value of the data to be stored, the data type of the data to be stored is converted from the floating-point type to the integer type), and the method for storing data according to this embodiment is described in detail below with reference to the data types possibly included by the data to be stored.

Figure 3:
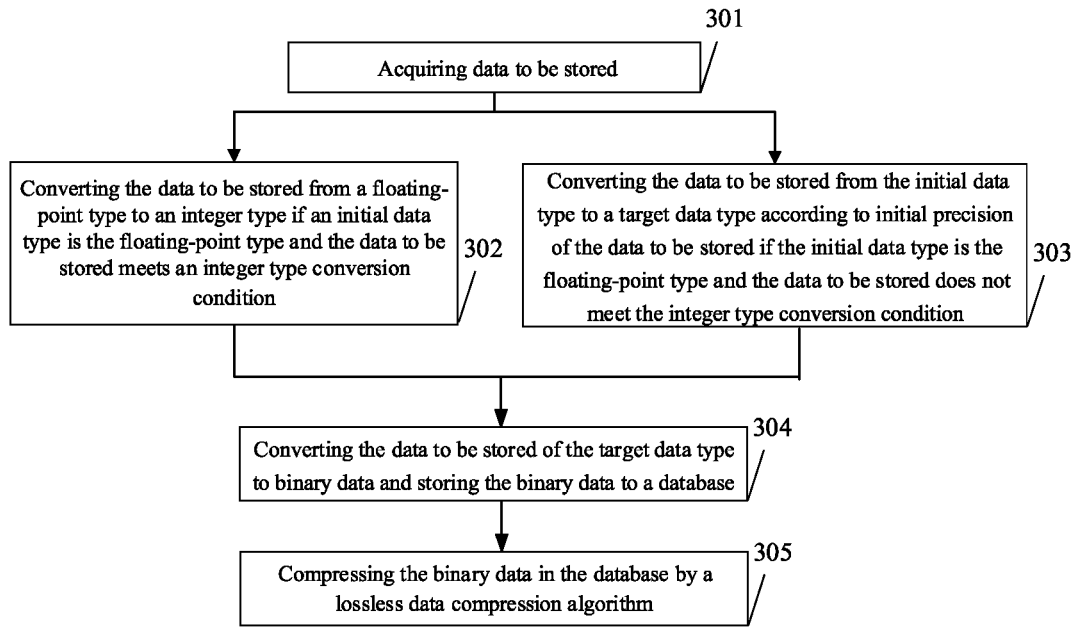
FIG. 3 is a flowchart of a method for storing data in accordance with another exemplary embodiment of the present disclosure.

FIG. 3 a flowchart of a method for storing data in accordance with one exemplary embodiment of the present disclosure, and this exemplary embodiment is executed by a computer device provided with a database. The method includes the following steps.

In step 301, data to be stored is acquired.

Reference may be made to the above step 201 for the implementation of this step, which is not repeated in this embodiment.

In some embodiments, step 302 is performed if an initial data type is a floating-point type and the data to be stored meets an integer type conversion condition; and step 303 is performed if the initial data type is the floating-point type and the data to be stored does not meet the integer type conversion condition.

In step 302, the data to be stored is converted from the floating-point type to an integer type if the initial data type is the floating-point type and the data to be stored meets the integer type conversion condition.

Floating-point data includes single-precision floating-point data and double-precision floating-point data. The byte size taken up by the single-precision floating-point data is 4 Byte, and the byte size taken up by the double-precision floating-point data is 8 Byte.

In one schematic example, in a wind power station data monitoring system, the initial data type of a temperature monitoring site is preset to a single-precision floating-point type, and data currently monitored by the temperature monitoring site is 28.000° C. It is obvious that a storage space of a database will be wasted if the data continues to be stored as the single-precision floating-point type.

In some embodiments, this step includes the following steps and is used for solving the problems involved in the foregoing schematic example.

I. A computer device acquires a decimal value of the data to be stored if the initial data type is the floating-point type and the data to be stored includes one decimal.

When storing the floating-point data, the computer device only retains the value of the first decimal place during storage if all decimals of the data are zero. For example, if the data to be stored is 1.000 of which the three decimals are all zero, when the computer device stores the data, the storage result is 1.0, i.e., only the value of the first decimal place of the data to be stored is retained.

In some embodiments, when the data stored by the computer device includes at least two decimals, in this embodiment, the data does not have the feature of being converted to integer data. For example, if the data to be stored is 1.010, in order to ensure the validity of the data to be stored, the solution provided in this embodiment fails to convert the data (1.010) to the integer data for storage.

Therefore, with reference to the characteristics of data storage by the computer device, in some embodiments, the integer conversion conditions in this embodiment are that the initial data type is the floating-point type, the data to be stored includes one decimal and the decimal value is zero.

II. If the decimal value is zero, the computer device determines that the data to be stored meets the integer type conversion condition, and converts the data to be stored from the floating-point type to the integer type.

In some embodiments, after the computer device acquires the decimal value of the data to be stored, it needs to judge whether the decimal value is zero according to the determined integer conversion conditions. If the decimal value is zero, it is determined that the data to be stored meets the integer type conversion condition, and the data to be stored is converted from the floating-point type to the integer type.

In one schematic example, in the wind power station data monitoring system, since the determination of a wind direction in a wind direction monitoring site involves complicated geographical locations and other factors, the initial data type of data monitored by this monitoring site is preset to the double-precision floating-point type (8 Byte storage). If part of the monitored data (the data to be stored) meets the integer type conversion condition, compared with the method of storing the monitored data as the initial data type, converting the monitored data to a byte integer type (1 Byte storage) for storage may save the storage space by nearly 90%.

In step 303, the data to be stored is converted from the initial data type to a target data type according to initial precision of the data to be stored if the initial data type is the floating-point type and the data to be stored does not meet the integer type conversion condition.

In some embodiments, the computer device further performs data type conversion on the data to be stored according to the initial precision of the data to be stored if the initial data type is the floating-point type and the data to be stored does not meet the integer type conversion condition.

In one schematic example, in the wind power station data monitoring system, the initial data type of data of the wind direction monitoring site is preset to the double-precision floating-point type (8 Byte storage). If significant data bits of part of monitored data (the data to be stored) only take up 2 Bytes, it is obvious that the storage space of the database will be wasted if the computer device continues to store the data as the double-precision floating-point type.

In some embodiments, this step includes the following substeps and is used for solving the problems involved in the foregoing schematic example.

I. The computer device acquires converted data by converting the data to be stored from double precision to single precision if the initial precision is double precision.

In some embodiments, the initial precision is the maximum significant digit number corresponding to the initial data type of the data to be stored. When the initial data type of the data to be stored is the double-precision floating-point type, the initial precision of the data to be stored is to retain 16 significant digits (decimalism); and when the initial data type of the data to be stored is the single-precision floating-point type, the initial precision of the data to be stored is to retain 8 significant digits (decimalism).

Optionally, based on the technical effect of saving the storage space of the database in the present disclosure, for the data type conversion of the floating-point data, the present disclosure includes only conversion from the double-precision floating-point data to single-precision floating-point data but not conversion from the single-precision floating-point data to the double-precision floating-point data.

II. The computer device converts the data to be stored from the double-precision floating-point type to the single-precision floating-point type if a decimal place of the converted data is consistent with that of the data to be stored.

Since the computer device is prone to loss of precision when converting the double-precision floating-point data to the single-precision floating-point data, in some embodiments, the computer device needs to check decimal places of the converted data. If the decimal places of the converted data are consistent with those of the data to be stored, it is determined that there is no loss of precision when the data type of the data to be stored is converted to the single-precision floating-point type.

In one schematic example, the initial data type of the data monitored by the monitoring site is preset to the double-precision floating-point type (8 Byte storage). If part of the monitored data (the data to be stored) may be converted to the single-precision floating-point type (4 Byte storage) without loss of precision, compared with the method of storing the monitored data as the initial data type, converting the monitored data to the single-precision floating-point type for storage may save the storage space of nearly 50%.

According to the contents of step 302 and step 303, the data type conversion of the floating-point data is realized. That is, the computer device converts the data to be stored from the initial data type to the target data type, so that the data length corresponding to the target data type is less than that corresponding to the initial data type.

In step 304, the data to be stored of the target data type is converted to binary data and the binary data is stored in the database.

Binary is a numerical system widely used in the computing technology, and currently, computer systems mainly employ binary systems.

In some embodiments, the computer device converts the data to be stored of the target data type to binary data and stores the binary data in the database.

In step 305, the binary data in the database is compressed by a lossless data compression algorithm.

After the data type conversion of the data to be stored is completed, in order to increase a data compression ratio as much as possible, in some embodiments, the computer device performs secondary compression on the binary data in the database with reference to the lossless data compression algorithm.

Lossless data compression is to express repetitive portions in the data by means of encoding to realize data compression. When reconstruction (or called reduction and decompression) is performed on the compressed data, the reconstructed data is completely the same as the original data. The lossless data compression algorithms involved in the embodiments of the present disclosure include but are not limited to a Simple 8B algorithm, a Run-Length Encoding (RLE) algorithm, a Raw encoding algorithm, a Packed encoding algorithm, a floating-point number exclusive OR (XOR) algorithm and a Snappy algorithm.

In summary, in this embodiment, when the acquired data to be stored is the floating-point data, the computer device determines whether the data to be stored meets the integer type conversion condition, if the data meets the integer type conversion condition, converts the data to be stored from the floating-point type to the integer type, and otherwise, converts the data to be stored from the initial data type to the target data type according to the initial precision of the data to be stored, so that the data length corresponding to the target data type is less than that corresponding to the initial data type, which reduces the data length of the floating-point data. In addition, the data to be stored that is subjected to binary serialization is stored in the database, and the lossless data compression is performed on the binary data in the database, such that the compression ratio is further increased. Thus, the data compression ratio is increased on the premise of not impairing the validity of the data.

Figure 4:
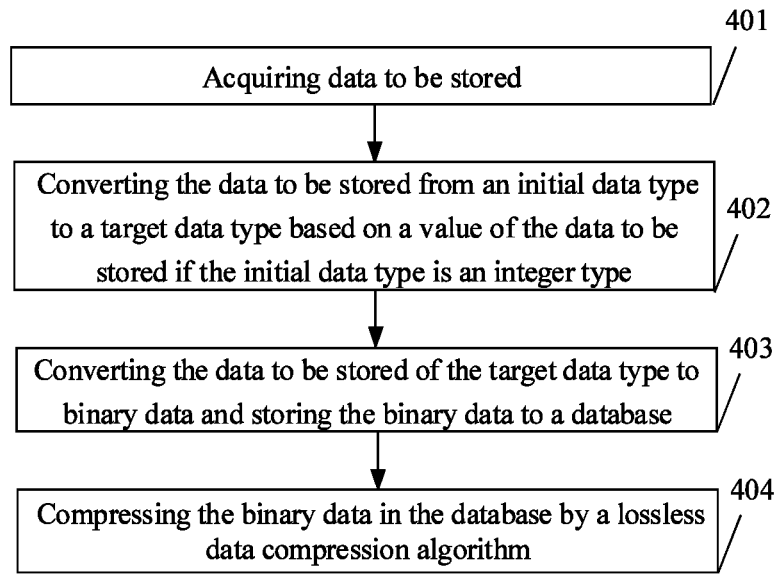
FIG. 4 is a flowchart of a method for storing data in accordance with yet another exemplary embodiment of the present disclosure.

FIG. 4 is a flowchart of a method for storing data in accordance with one exemplary embodiment of the present disclosure, and this exemplary embodiment is executed by a computer device equipped with a database. A method for storing the database is based on the method for storing data according to this embodiment. The method includes the following steps.

In step 401, data to be stored is acquired.

Reference may be made to the above step 201 for the implementation of this step, which is not repeated in this embodiment.

In step 402, the computer device converts the data to be stored from an initial data type to a target data type based on a value of the data to be stored if the initial data type is an integer type.

Compared with floating-point data, integer data has a shorter data length during storage. In some embodiments, if data type conversion is continuously performed on the data to be stored based on the value of the data to be stored, the data length of the data to be stored may be reduced further.

Integer types include a byte integer type (1 Byte), a short integer type (2 Byte), an ordinary integer type (4 Byte), and a long integer type (>4 Byte). The byte integer type includes a value range interval [−128, 127], the short integer type includes a value range interval [−32768, 32767], the ordinary integer type includes a value range interval [−2147483648, 2147483647], and data beyond the above range intervals belongs to long integer data.

In some embodiments, this step includes the following substeps.

I. The computer device determines a target value interval in which the value of the data to be stored lies.

Since the initial data type of the data to be stored is preset, there is a case where the data to be stored may be converted to a data type of a smaller storage byte.

In one schematic example, the data type of a certain monitoring site is an ordinary integer type, and the value of the data to be stored is 156. If the computer device converts the data to be stored to short integer data for storage, the storage space may be saved by nearly 50%.

In some embodiments, the computer device determines a target value interval where the value of the data to be stored lies. The target value interval includes at least one of the value range intervals included by the byte integer type, the short integer type, the ordinary integer type, and the long integer type mentioned above.

In one schematic example, if the data type of a certain monitoring site is a long integer type, and the computer device acquires data A to be stored (the value is 64) of the monitoring site, candidate intervals of the target value interval of the data A to be stored include the value range intervals included by the byte integer type, the short integer type, and the ordinary integer type. Based on the technical effect of saving the storage space of the database in the present disclosure, the computer device determines the value range interval included in the byte integer type as the target value interval.

II. The computer device converts the data to be stored to a target integer type corresponding to a target integer data length according to the target integer data length corresponding to the target value interval.

Optionally, the target integer type includes at least one of the byte integer type, the short integer type, the ordinary integer type, and the long integer type.

In the above schematic example, if the target value interval of the data 1 to be stored is the value range interval included in the byte integer type, the computer device converts the data 1 to be stored to the target integer type (byte integer type) corresponding to the target integer data length (1 Byte) according to the target integer data length (1 byte) corresponding to the target value interval.

In step 403, the data to be stored of the target data type is converted to binary data and the binary data is stored in the database.

Reference may be made to the above step 304 for the implementation of this step, which is not repeated in this embodiment.

In step 404, the binary data in the database is compressed by a lossless data compression algorithm.

Reference may be made to the above step 305 for the implementation of this step, which is not repeated in this embodiment.

In some embodiments, steps 402 to 403 are performed after step 302. That is, after the data to be stored (the floating-point data in the above embodiment) meets the integer type conversion condition, the computer device converts the data to be stored from the initial data type to the target data type based on the value of the data to be stored, converts the converted data to be stored to binary data, stores the binary data in the database, and performs lossless data compression on the binary data in the database.

In summary, in this embodiment, when the acquired data to be stored is integer data, the computer device determines the target value interval in which the value of the data to be stored lies, and converts the data to be stored to the target integer type corresponding to the target integer data length according to the target integer data length corresponding to the target value interval, so that the data length corresponding to the target data type is less than that corresponding to the initial data type. Compared with the method of directly storing data to be stored to a database in the related art, the method of performing data type conversion before data storage in this embodiment greatly improves a compression effect of the integer data, and further saves the storage space of the database.

Figure 5:
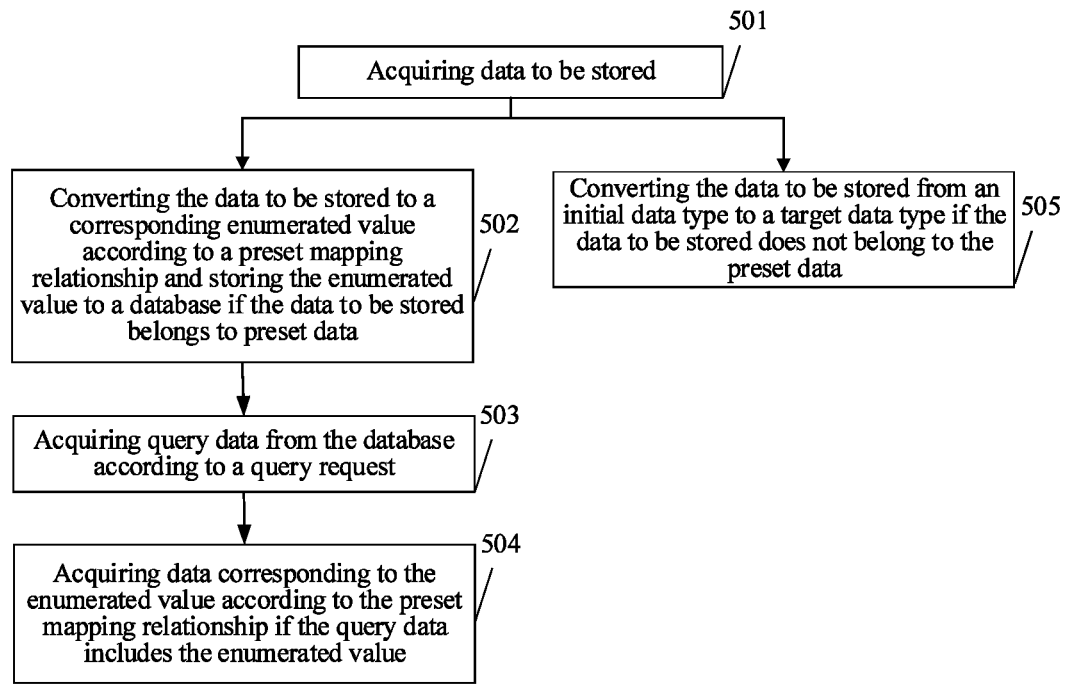
FIG. 5 is a flowchart of a method for storing data in accordance with still another exemplary embodiment of the present disclosure.

FIG. 5 is a flowchart of a method for storing data in accordance with one exemplary embodiment of the present disclosure, and this exemplary embodiment is executed by a computer device equipped with a database. A method for storing the database is based on the method for storing data according to this embodiment. The method includes the following steps.

In step 501, data to be stored is acquired.

Reference may be made to the above step 201 for the implementation of this step, which is not repeated in this embodiment.

In some embodiments, step 502 is performed if the data to be stored belongs to preset data, and step 505 is performed if the data to be stored does not belong to the preset data.

In step 502, if the data to be stored belongs to preset data, the data to be stored is converted to a corresponding enumerated value according to a preset mapping relationship and the enumerated value is stored in the database.

An actual data monitoring system includes the data to be stored as the preset data, e.g., relatively fixed data in a monitoring process such as the type, monitoring time and a monitoring distance of each monitoring site. If a large amount of the above-mentioned preset data repeatedly appears during data collection, a problem of wasting the storage space of the database will be caused to a certain extent.

In some embodiments, the computer device converts the complicated preset data or the preset data that takes up more bytes during storage to the corresponding enumerated value according to the preset mapping relationship, and stores the converted enumerated value in the database.

Optionally, the mapping relationship may be a user-defined mapping relationship, or a mapping relationship template pre-stored in the computer device, which is not limited in the embodiments of the present disclosure.

In one schematic example, the data monitoring system has some fixed values, e.g., 220.0 V AC voltage. The storage space of the database will be wasted if the computer device directly stores the fixed values. At this time, the computer device may map data corresponding to the AC voltage into an integer 1, and the integer 1 is the corresponding enumerated value and is stored in the database. The initial data type corresponding to the AC voltage data is a floating-point type, and after the AC voltage data is converted to the enumerated value via the preset mapping relationship, the data type of the AC voltage is converted to an integer type, which saves the storage space of the database to a certain extent.

In another schematic example, data of an on/off type generally exists in the actual application process. At this time, on or off may be mapped with one Bit, on is mapped to 1, and off is mapped to 0. That is, the computer device will map one integer or Boolean data to one Bit for storage, which also saves the storage space of the database to a certain extent.

In some embodiments, the computer device converts the enumerated value to binary data, stores the binary data in the database, and compresses the binary data in the database by a lossless data compression algorithm.

In some embodiments, step 503 and step 504 are further included after step 502.

In step 503, query data is acquired from the database in response to a query request.

In some embodiments, the computer device stores the data to be stored in the database, and performs an efficient data query by the query request when the data to be stored is required.

In step 504, data corresponding to the enumerated value is acquired according to the preset mapping relationship if the query data includes the enumerated value.

Before the preset data is stored in the database, the computer device has converted the preset data to the enumerated value according to the preset mapping relationship and stored the enumerated value in the database. Therefore, in some embodiments, a user enters the enumerated value via a query channel of the computer device, and the computer device correspondingly queries out the preset data corresponding to the entered enumerated value according to the preset mapping relationship.

In the schematic example shown in step 502, the user may query and acquire the preset data corresponding to the integer 1 by entering the integer 1 via the query channel of the database provided by the computer device, i.e., AC voltage 220.0V.

However, it is worth noting that in the process of determining the mapping relationship of the preset data, the computer device may not map the multiple preset data to the same enumerated value; otherwise, multiple preset data will be queried out when data query is performed by entering the enumerated value in the database. As a result, target query data that the user expects may not be obtained.

In some embodiments, the above case that the multiple preset data is mapped into the same enumerated value does not include customized definition, i.e., does not include the case that the user defines the multiple preset data as the same enumerated value.

In step 505, the data to be stored is converted from the initial data type to the target data type if the data to be stored does not belong to the preset data.

Correspondingly, if the data to be stored does not belong to the preset data mentioned in step 502, in some embodiments, the computer device continues to determine whether the data to be stored is integer data or floating-point data, i.e., the computer device continues to perform the method for storing data as illustrated in FIGS. 3 and 4 after step 505.

In summary, in this embodiment, when the acquired data to be stored is the preset data, the computer device converts the data to be stored to the corresponding enumerated value according to the preset mapping relationship. If the data to be stored does not belong to the preset data, the data to be stored is converted from the initial data type to the target data type according to the method for storing data according to the above embodiment. Compared with a method of directly storing a large amount of preset data to a database in the related art, the enumerated value mapping method according to this embodiment has the advantage that a large amount of preset data is converted to the enumerated values for storage through the preset mapping relationship, which further saves the storage space of the database.

Figure 6:
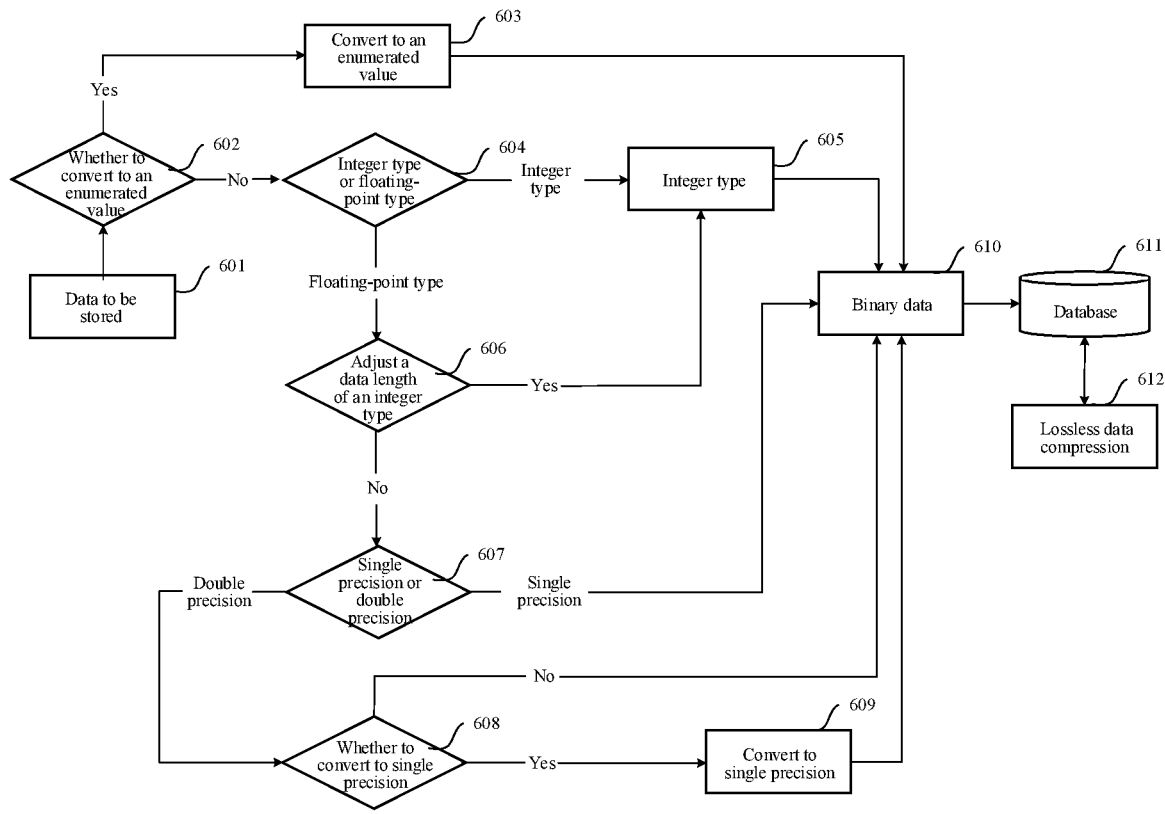
FIG. 6 is a flowchart of a method for storing data in accordance with still yet another exemplary embodiment of the present disclosure.

The methods for storing data used when the data to be stored is of different data types are respectively listed in the above embodiments, and as illustrated in FIG. 6, the technical solutions according to the above embodiments are combined by means of a flowchart, such that the methods for storing data according to the embodiments of the present disclosure are further described more completely in detail.

In step 601, data to be stored is acquired.

In some embodiments, step 602 is performed after step 601.

In step 602, whether the data to be stored may be converted to an enumerated value is judged.

In some embodiments, a computer device performs a first judgment, i.e., the computer device judges whether the data to be stored can be converted to the enumerated value, if the data can be converted to the enumerated value, step 603 is performed, and otherwise, the computer device continues to perform a second judgment.

In step 603, the data to be stored is converted to the enumerated value.

In some embodiments, step 610 is performed after step 603.

In step 604, whether the data to be stored is integer data or floating-point-type data is judged.

In some embodiments, the computer device performs the second judgment, i.e., the computer device judges whether the data to be stored is the integer data or the floating-point data, step 605 is performed if it is the integer data, and the computer device continues to perform a third judgement if it is the floating-point data.

In step 605, the integer data is adjusted in length according to a value of the data to be stored.

In some embodiments, step 610 is performed after step 605.

In step 606, whether the data to be stored may be converted to an integer type is judged.

In some embodiments, the computer device performs the third judgment, i.e., the computer device judges whether the data to be stored can be converted to the integer type, if the data can be converted to the integer type, step 605 is performed, and otherwise, the computer device continues to perform a fourth judgment.

In step 607, whether the data to be stored is single-precision floating-point data or double-precision floating-point data is judged.

In some embodiments, the computer device performs the fourth judgment, i.e., the computer device judges whether the data to be stored is the single-precision floating-point data or the double-precision floating-point data, step 610 is performed if it is the single-precision floating-point data, and the computer device continues to perform a fifth judgment if it is the double-precision floating-point data.

In step 608, whether the data to be stored may be converted to the single-precision floating-point data is judged.

In some embodiments, the computer device performs the fifth judgment, i.e., the computer device judges whether the data to be stored may be converted to the single-precision floating-point data, if the data can be converted to the single-precision floating-point data, step 609 is performed, and otherwise, step 610 is performed.

In step 609, the data to be stored is converted to the single-precision floating-point data.

In some embodiments, step 610 is performed after step 609.

In step 610, the data to be stored that is subjected to data type conversion (including data to be stored that is subjected to data type conversion) is converted to binary data.

In some embodiments, step 611 is performed after step 610.

In step 611, the binary data is stored to a database.

In some embodiments, step 612 is performed after step 611.

In step 612, the binary data in the database is compressed by a lossless data compression algorithm.

In summary, in this embodiment, the computer device converts the data to be stored to data of the corresponding target data type according to different initial data types and judgment results of the data to be stored, such that compression of the data of different data types is realized. Compared with a method of directly storing the data to be stored to a database in the related art, the method for storing data according to this embodiment has the advantage that since data type conversion is performed on the data to be stored, and lossless data compression is performed on the data to be stored that is stored to the database, a storage space of the database is greatly saved.

Figure 7:
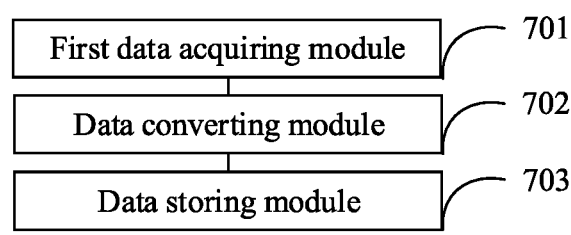
FIG. 7 is a structural block diagram of an apparatus for storing data in accordance with one exemplary embodiment of the present disclosure.

FIG. 7 is a structural block diagram of an apparatus for storing data in accordance with one embodiment of the present disclosure. The apparatus may be implemented as all or part of a computer device through software, hardware or a combination thereof.

The apparatus includes: a first data acquiring module 701, configured to acquire data to be stored; a data converting module 702, configured to convert the data to be stored from an initial data type to a target data type, wherein a data length corresponding to the target data type is less than that corresponding to the initial data type; and a data storing module 703, configured to store the data to be stored of the target data type to a database.

The data conversion module 702 includes: a first converting sub-module, configured to convert the data to be stored from a floating-point type to an integer type if the initial data type is the floating-point type and the data to be stored meets an integer type conversion condition; and a second converting sub-module, configured to convert the data to be stored from the initial data type to the target data type according to initial precision of the data to be stored if the initial data type is the floating-point type and the data to be stored does not meet the integer type conversion condition.

Optionally, the first converting sub-module is configured to acquire a decimal value of the data to be stored if the initial data type is the floating-point type and the data to be stored includes one decimal; and determine that the data to be stored meets the integer type conversion condition and to convert the data to be stored from the floating-point type to the integer type if the decimal value is zero.

Optionally, the second converting sub-module is configured to acquire converted data by converting the data to be stored from double precision to single precision if the initial precision is the double precision; and convert the data to be stored from a double-precision floating-point type to a single-precision floating-point type if a decimal place of the converted data is consistent with that of the data to be stored.

The data storing module 703 includes a third converting sub-module, configured to convert the data to be stored from the initial data type to the target data type according to a value of the data to be stored if the initial data type is an integer type.

Optionally, the third converting sub-module is configured to determine a target value interval of the value of the data to be stored; and convert the data to be stored to a target integer type corresponding to a target integer data length according to the target integer data length corresponding to the target value interval, the target integer type including at least one of a byte integer type, a short integer type, an ordinary integer type and a long integer type.

Optionally, the apparatus further includes an enumerated value storing module, configured to convert the data to be stored to a corresponding enumerated value according to a preset mapping relationship and store the enumerated value to the database if the data to be stored belongs to preset data.

The data storing module 703 includes a fourth converting sub-module configured to convert the data to be stored from the initial data type to the target data type if the data to be stored does not belong to the preset data.

Optionally, the apparatus further includes: a data querying module, configured to acquire query data from the database according to a query request; and a second data acquiring module, configured to acquire data corresponding to the enumerated value according to the preset mapping relationship if the query data includes the enumerated value.

The data storage module 703 includes a fifth converting sub-module, configured to convert the data to be stored of the target data type to binary data and to store the binary data to the database.

Optionally, the apparatus further includes a data compressing module, configured to compress the binary data in the database by a lossless data compression algorithm.

Figure 8:
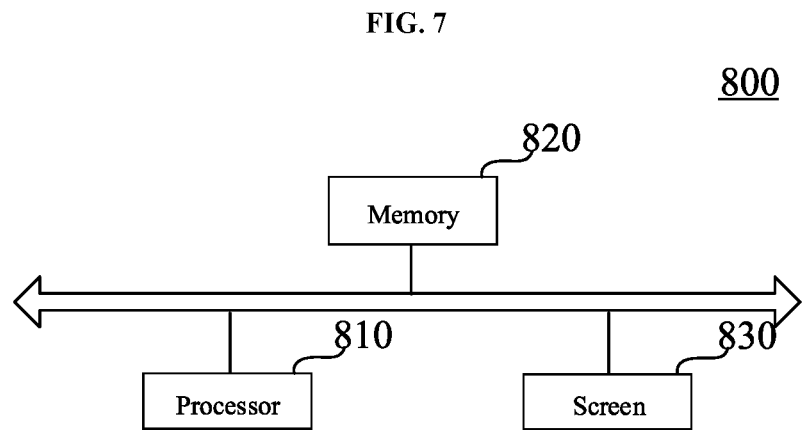
FIG. 8 is a schematic structural diagram of a computer device in accordance with one exemplary embodiment of the present disclosure.

FIG. 8 is a structural block diagram of a computer device 800 in accordance with one exemplary embodiment of the present disclosure. The computer device 800 may be an electronic device equipped with and miming an application, such as a smart phone, a tablet computer, an e-book or a portable personal computer. The computer device 800 in the present disclosure may include one or more of the following components: a processor 810, a memory 820 and a screen 830.

The processor 810 may include one or more processing cores. The processor 810 connects various portions within the entire computer device 800 using various interfaces and lines, and executes various functions of the computer device 800 and processes data by running or executing an instruction, program, code set or instruction set stored in the memory 820, and invoking data stored in the memory 820. Optionally, the processor 810 may be implemented by using at least one of hardware forms of a digital signal processor (DSP), a field-programmable gate array (FPGA), and a programmable logic array (PLA). The processor 810 may integrate one or a combination of more of a central processing unit (CPU), a graphics processing unit (GPU), a modem, and the like. The CPU mainly processes operating systems, user interfaces, applications, etc.; the GPU mainly renders and draws the content required to be displayed by the screen 830; and the modem is used for handling wireless communication. It can be understood that the above modem may also not be integrated into the processor 810 and is independently implemented by one communication chip.

The memory 820 may include a random access memory (RAM), and may also include a read-only memory (ROM). Optionally, the memory 820 includes a non-transitory computer-readable storage medium. The memory 820 may be used for storing instructions, programs, codes, a code set, or an instruction set. The memory 820 may include a program storage area and a data storage area. The program storage area may store an instruction for implementing an operating system, an instruction for implementing at least one function (e.g., a touch function, an audio playing function and an image playing function), instructions for implementing the various method embodiments described above, and the like. The operating system may be an Android system (including a system based on Android system in-depth development), an IOS system (including a system based on IOS system in-depth development) developed by Apple Inc. or other systems. The data storage area may also store data (e.g., contacts, audio and video data and chat history data) created by the computer device in use, and the like.

The screen 830 may be a touch display screen for receiving touch operations on or near the screen by a user using any suitable object, such as a finger and a touch pen, as well as displaying a user interface of each application. The touch display screen is usually disposed on a front panel of the computer device 800. The touch display screen may be designed as a full screen, a curved screen, or an anomalous screen. The touch display screen may also be designed as a combination of a full screen and a curved screen, or a combination of an anomalous screen and a curved screen, which is not limited in the embodiments of the present disclosure.

The memory stores at least one instruction, at least one program, a code set, or an instruction set. The at least one instruction, the at least one program, the code set or the instruction set, when loaded and executed by a processor, causes the processor to perform the steps in the methods for storing data as described above.

An embodiment of the present disclosure further provides a computer-readable storage medium storing at least one instruction, at least one program, a code set, or an instruction set stored therein. The at least one instruction, the at least one program, the code set, or the instruction set, when loaded and executed by a processor, causes the processor to perform the steps in the methods for storing data as described above.

Optionally, the computer-readable storage medium may include a ROM, a RAM, a solid state drive (SSD), an optical disk or the like. The RAM may include a resistance random access memory (ReRAM) and a dynamic random access memory (DRAM).

The serial numbers of the embodiments of the present disclosure are merely for description, and do not represent the priority of the embodiments. Described above are merely optional embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. A method for storing data, comprising:
   acquiring data to be stored;
   converting the data to be stored from an initial data type to a selected one of a plurality of target data types depending on the data, a data length corresponding to the selected target data type being less than that corresponding to the initial data type;
   converting the data to be stored of the target data type to binary data;
   storing the binary data to a database configured to store data converted to any of the plurality of target data types; and
   compressing the binary data in the database by a lossless data compression algorithm;
   wherein the plurality of target data types includes at least any two of an integer type, a double-precision floating-point type and a single-precision floating-point type.

2. The method according to claim 1, wherein converting the data to be stored from the initial data type to the selected one of the plurality of target data types depending on the data comprises:
   converting the data to be stored from a floating-point type to an integer type if the initial data type is the floating-point type and the data to be stored meets an integer type conversion condition; and
   converting the data to be stored from the initial data type to another selected one of the plurality target data types according to initial precision of the data to be stored if the initial data type is the floating-point type and the data to be stored does not meet the integer type conversion condition.

3. The method according to claim 2, wherein converting the data to be stored from the initial data type to another selected one of the plurality of target data types according to the initial precision of the data to be stored comprises:
   acquiring converted data by converting the data to be stored from double precision to single precision if the initial precision is the double precision; and
   converting the data to be stored from a double-precision floating-point type to a single-precision floating-point type if a decimal place of the converted data is consistent with that of the data to be stored.

4. The method according to claim 2, wherein converting the data to be stored from the floating-point type to the integer type if the initial data type is the floating-point type and the data to be stored meets the integer type conversion condition comprises:
   acquiring a decimal value of the data to be stored if the initial data type is the floating-point type and the data to be stored comprises one decimal; and
   determining that the data to be stored meets the integer type conversion condition and converting the data to be stored from the floating-point type to the integer type if the decimal value is zero.

5. The method according to claim 1, wherein converting the data to be stored from the initial data type to a selected one of the plurality of target data types depending on the data comprises:
   converting the data to be stored from the initial data type to the selected one of the plurality of target data types based on a value of the data to be stored if the initial data type is an integer type.

6. The method according to claim 5, wherein converting the data to be stored from the initial data type to the selected one of the plurality of target data types based on the value of the data to be stored comprises:
   determining a target value interval of the value of the data to be stored; and
   converting the data to be stored to a target integer type corresponding to a target integer data length according to the target integer data length corresponding to the target value interval, the target integer type comprising at least one of a byte integer type, a short integer type, an ordinary integer type, and a long integer type.

7. The method according to claim 1, wherein after acquiring the data to be stored, the method further comprises:
   converting the data to be stored to a corresponding enumerated value according to a preset mapping relationship and storing the enumerated value to the database if the data to be stored belongs to preset data; and
   converting the data to be stored from the initial data type to the selected one of the plurality of target data types comprises:
   converting the data to be stored from the initial data type to the selected one of the plurality of target data types if the data to be stored does not belong to the preset data.

8. The method according to claim 1, wherein the data comprises temperature data, humidity data, wind direction data, and a number of electric generators currently operating normally data acquired by a wind power station data monitoring system.

9. An apparatus for storing data, comprising:
   a data acquiring module, configured to acquire data to be stored;
   a data converting module, configured to convert the data to be stored from an initial data type to a selected one of a plurality of target data types depending on the data, a data length corresponding to the target data type being less than that corresponding to the initial data type;

a data storing module, configured to convert the data to be stored of the target data type to binary data and store the binary data to a database configured to store data converted to any one of the plurality of target data types; and a data compressing module, configured to compress the binary data in the database by a lossless data compression algorithm;

wherein the plurality of target data types includes at least any two of an integer type, a double-precision floating-point type and a single-precision floating-point type.

10. A computer device, comprising a processor and a memory storing at least one instruction, wherein the at least one instruction, when executed by the processor, causes the processor to perform the method for storing data as defined in claim 1.

11. A computer-readable storage medium storing at least one instruction, wherein the at least one instruction, when executed by a processor, causes the processor to perform the method for storing data as defined in claim 1.

12. The apparatus according to claim 9, wherein the data comprises temperature data, humidity data, wind direction data, and a number of electric generators currently operating normally data acquired by a wind power station data monitoring system.

* * * * *